(12) United States Patent
Kim (10) Patent No.: US 7,364,933 B2
(45) Date of Patent: Apr. 29, 2008

(54) IMAGE SENSOR AND METHOD FOR FORMING THE SAME

(75) Inventor: Ki-Hong Kim, Yongin-si (KR)

(73) Assignee: Samsung Electronics, Co., Ltd., Suwon-Si (KR)

( * ) Notice: Subject to any disclaimer, the term of this patent is extended or adjusted under 35 U.S.C. 154(b) by 225 days.

(21) Appl. No.: 11/334,936

(22) Filed: Jan. 19, 2006

(65) Prior Publication Data

US 2006/0170069 A1    Aug. 3, 2006

(30) Foreign Application Priority Data

Feb. 2, 2005    (KR)    ............. 10-2005-0009541

(51) Int. Cl.
*H01L 21/00* (2006.01)
(52) U.S. Cl. .............. 438/65; 438/70; 257/E21.121; 257/E21.127
(58) Field of Classification Search ............ 438/65–70, 438/E31.121, E21.127
See application file for complete search history.

(56) References Cited

U.S. PATENT DOCUMENTS 6,576,940 B2 * 6/2003 Maeda ................. 257/292
7,232,698 B2 * 6/2007 Kim .................... 438/48
2006/0183265 A1 * 8/2006 Oh et al. ............ 438/65
2007/0105360 A1 * 5/2007 Hong .................. 438/612

FOREIGN PATENT DOCUMENTS

KR    10-2001-0067213 A    7/2001
KR    10-2002-0014519 A    2/2002

* cited by examiner

*Primary Examiner*—Cuong Nguyen
(74) *Attorney, Agent, or Firm*—F. Chau & Associates, LLC.

(57) ABSTRACT

A method for forming an image sensor is provided. The method includes providing a semiconductor substrate having a pixel region and a peripheral circuit region, forming a photoelectric transformation section at the semiconductor substrate of the pixel region, forming a plurality of interlayer dielectrics over the semiconductor substrate with interconnections interposed therebetween, forming a passivation layer, partially patterning the passivation layer at the peripheral circuit region to form a via hole exposing the interconnection and removing the passivation layer and the underlying interlayer dielectric at the pixel region. The method further includes forming a conductive layer to fill the via hole and etching the conductive layer to remove the conductive layer at the pixel region and form a via plug and a conductive pad at the peripheral circuit region. The via plug fills the via hole and the conductive pad protrudes outwardly from the via hole.

15 Claims, 6 Drawing Sheets

IMAGE SENSOR AND METHOD FOR FORMING THE SAME

PRIORITY STATEMENT

This application claims priority of Korean Patent Application No. 2005-09541, filed on Feb. 2, 2005 in the Korean Intellectual Property Office, the disclosure of which is incorporated by reference herein in its entirety.

BACKGROUND OF THE INVENTION

1. Field of the Invention

The present invention is directed to image sensors and to methods for forming the same.

2. Description of Related Art

Image sensors are semiconductor devices for converting an optical image into an electrical signal. Generally, image sensors are classified into charge coupled devices (CCDs) or complementary metal-oxide-silicon (CMOS) image sensors. CCD image sensors have certain benefits over CMOS image sensors such as having higher photosensitivity and better noise characteristics in comparison to CMOS image sensors. However, CMOS image sensors also hold several key benefits over CCD image sensors in that for example, CMOS image sensors may be prepared by simple processes, are suitable for high integration, and exhibit low power consumption. CCD image sensors on the other hand exhibit high power consumption and are generally not suitable for high integration processes.

With the increasing demand for highly integrated semiconductor devices, studies are being conducted for improving the characteristics of CMOS image sensors. A pixel of a conventional CMOS image sensor includes photodiodes for receiving light and CMOS elements for controlling image signals from the photodiodes. In the photodiodes of the conventional CMOS image sensor, electron-hole pairs are generated based upon the wavelength and intensity of red, green, and blue lights impinging through a color filter. In addition, output signals vary with the amount of the electrons generated.

A conventional image sensor such as the above-described CMOS image sensor typically has a pixel region where a photoelectric transformation section is formed and also a peripheral circuit region for detecting signals from the pixel region. The peripheral circuit region is disposed to surround the pixel region. Moreover, an image sensor also includes multi-layer interconnections, interlayer dielectrics, and etch-stop layers. It is also noted that the greater the number of etch-stop layers that an image sensor has, the lower the transmittance of incident light will be for the image sensor. For the above reason, the intensity of light reaching the photodiode is lower than that of light impinging upon the highest layer. Thus, to enhance the photosensitivity of an image sensor, there is a need for a process which removes unnecessary interlayer dielectrics and etch-stop layers and which is also a relatively simple and cost effective process.

SUMMARY OF THE INVENTION

In an exemplary embodiment of the present invention, a method for forming an image sensor is provided. The method includes providing a semiconductor substrate having a pixel region and a peripheral circuit region, forming a photoelectric transformation section at the semiconductor substrate of the pixel region, forming a plurality of interlayer dielectrics over the semiconductor substrate with interconnections interposed therebetween, forming a passivation layer, partially patterning the passivation layer at the peripheral circuit region to form a via hole exposing the interconnection and removing the passivation layer and the underlying interlayer dielectric at the pixel region. The method further includes forming a conductive layer to fill the via hole and etching the conductive layer to remove the conductive layer at the pixel region and form a via plug and a conductive pad at the peripheral circuit region. The via plug fills the via hole and the conductive pad protrudes outwardly from the via hole.

In another exemplary embodiment, a method for forming an image sensor is provided. The method includes preparing a semiconductor substrate having a pixel region and a peripheral circuit region, forming device isolation layers on the semiconductor substrate to define active regions, forming a photoelectric transformation section at the active region of the pixel region, forming a shield layer on an entire surface of the semiconductor substrate and forming a plurality of intermediate interconnection layers on the shield layer. Each of the intermediate interconnection layers includes a first etch-stop layer, a first interlayer dielectric on the first etch-stop layer, and a first interconnection overlapping the device isolation layer at the active region and penetrating the first interlayer dielectric and the first etch-stop layer. The method further includes forming at least one top interconnection layer on the intermediate interconnection layer, the top interconnection layer including a second etch-stop layer, a second interlayer dielectric on the second etch-stop layer, and a second interconnection disposed only at the peripheral circuit region and penetrating the second interlayer dielectric and the second etch-stop layer, forming a passivation layer on the top interconnection layer, partially patterning the passivation layer at the peripheral circuit region to form a via hole exposing the second interconnection while removing the passivation layer and the top interconnection layer at the pixel region to expose the intermediate interconnection layer, forming a conductive layer to fill the via hole, and etching the conductive layer to remove the conductive layer at the pixel region and form a via plug and a conductive pad at the peripheral circuit region. The via plug fills the via hole and the conductive layer protrudes outwardly from the via hole.

In another exemplary embodiment, an image sensor is provided. The image sensor includes a semiconductor substrate having a pixel region and a peripheral circuit region, a device isolation layer disposed at the semiconductor substrate to define an active region, a photoelectric transformation section disposed in the semiconductor substrate at the pixel region, a shield layer disposed on the semiconductor substrate and a plurality of intermediate interconnection layers disposed on the shield layer. Each of the intermediate interconnection layers includes a first etch-stop layer, a first interlayer dielectric on the first etch-stop layer, and a first interconnection overlapping the device isolation layer at the active region and penetrating the first interlayer dielectric and the first etch-stop layer. The image sensor further includes at least one top interconnection layer disposed on the intermediate interconnection layer, the top interconnection layer including a second etch-stop layer, a second interlayer dielectric on the second etch-stop layer, and a second interconnection disposed only at the peripheral circuit region and penetrating the second interlayer dielectric and the second etch-stop layer, a passivation layer disposed on the top interconnection layer, a via plug connected to the second interconnection through the passivation layer and a conductive pad at the peripheral circuit region, a resin layer connected to the shield layer through the interlayer dielectric and the first etch-stop layer of the intermediate dielectric at the pixel region, a planarization layer disposed to cover the conductive pad, the top interconnection layer, the resin layer, and the intermediate interconnection layer, and a color filter layer and a microlens disposed on the planarization layer at the pixel region.

DETAILED DESCRIPTION OF THE EXEMPLARY EMBODIMENTS OF THE INVENTION

The present invention will now be described more fully hereinafter with reference to the accompanying drawings, in which preferred embodiments of the invention are shown. The invention may, however, be embodied in different forms and should not be construed as limited to the embodiments set forth herein. The invention may be applied to, for example, methods of forming CMOS or CCD image sensors. In the drawings, the height of layers and regions are exaggerated for clarity. It will also be understood that when a layer is referred to as being "on" another layer or substrate, it can be directly on the other layer or substrate, or intervening layers may also be present. Like numbers refer to like elements throughout.

As illustrated in the exemplary embodiment of FIGS. 1-6, device isolation layers 3 are formed at a semiconductor substrate 1 having a pixel region CE and a peripheral circuit region PE to define active regions. Impurities are implanted into the active region to form a photoelectric transformation section 5 such as a photodiode. When light impinges on the photoelectric transformation section 5, electron-hole pairs are generated in the photoelectric transformation section 5. Transistors 7 are formed on the substrate 1. Moreover, transistors are disposed at the pixel region CE to sense charges generated at the photoelectric transformation section 5 and transmit signals. A shield layer 8 is formed on substantially the entire surface of the substrate 1 to shield the photoelectric transformation section 5 from subsequent processes. An intermediate interconnection layer 15 is formed on the substrate 1. The intermediate interconnection layer 15 includes a first etch-stop layer 9a, a first interlayer dielectric 11a, and first interconnections 13a penetrating the first interlayer dielectric 112a and the first etch-stop layer 9a. In the pixel region CE, the first interconnections 13a overlap the device isolation layers 3 to prevent interference of a path of light impinging on the photoelectric transformation section 5. A top interconnection layer 17 is formed on the intermediate interconnection layer 15. The top interconnection layer 17 includes a second etch-stop layer 9b, a second interlayer dielectric 11b, and second interconnections 13b penetrating the second interlayer dielectric 11b and the second etch-stop layer 9b. The second interconnections 13b are not disposed on the pixel region CE, but rather are disposed only at the peripheral circuit region PE. The etch-stop layers 9a and 9b are made of, for example, silicon nitride ($Si_3N_4$). The interlayer dielectrics 11a and 11b are made of, for example, silicon oxide ($SiO_2$) or silicon oxyfluoride (SiOF). A passivation layer 21 is formed on the top interconnection layer 17. The passivation layer 21 is a triple layer made of, for example, silicon nitride-silicon oxide-silicon nitride. The passivation layer 21 serves to block external moisture.

Figure 1:
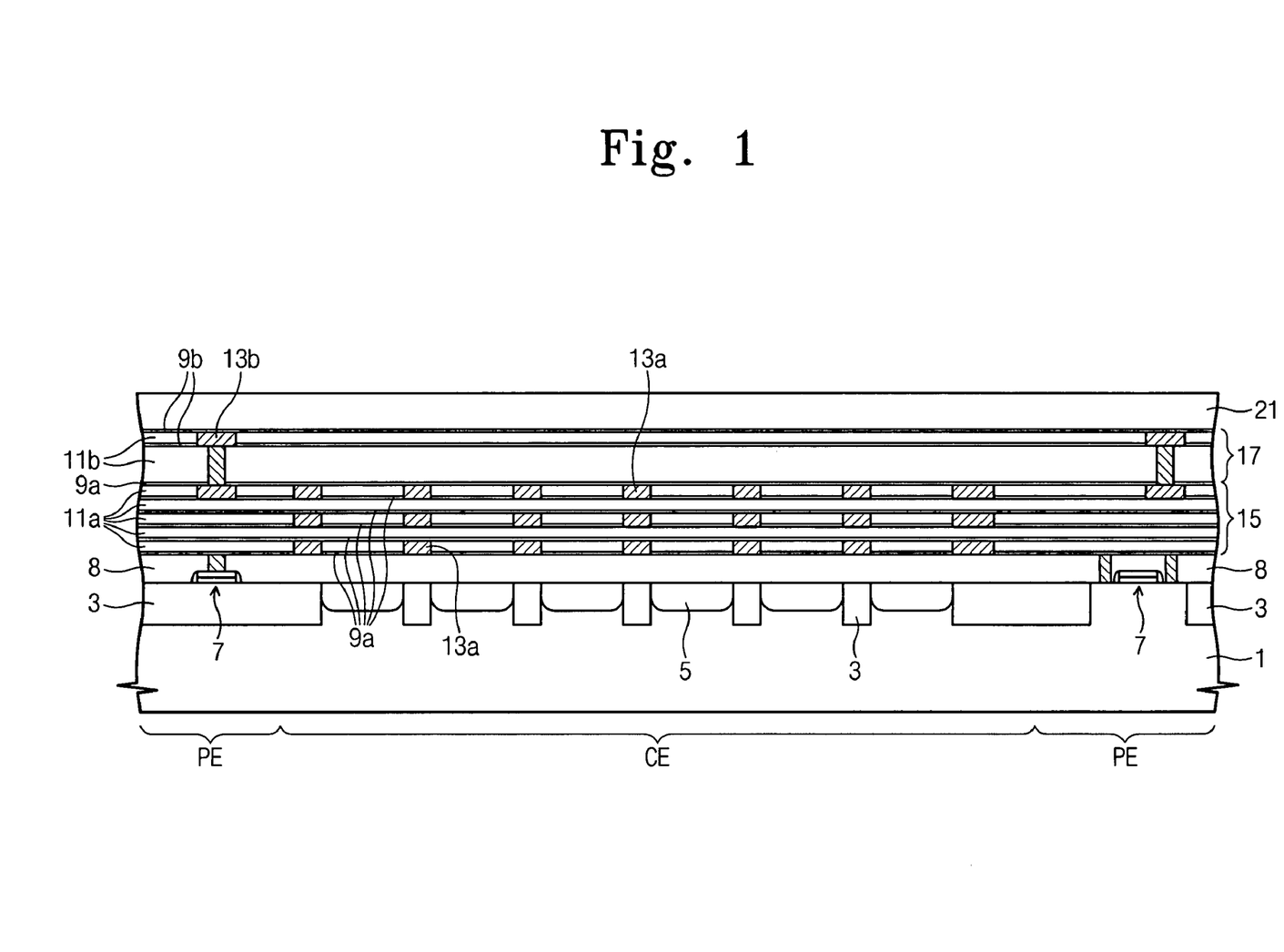
FIG. 1 through FIG. 6 are flow diagrams showing the steps of forming an image sensor according to an exemplary embodiment of the present invention.
Figure 2:
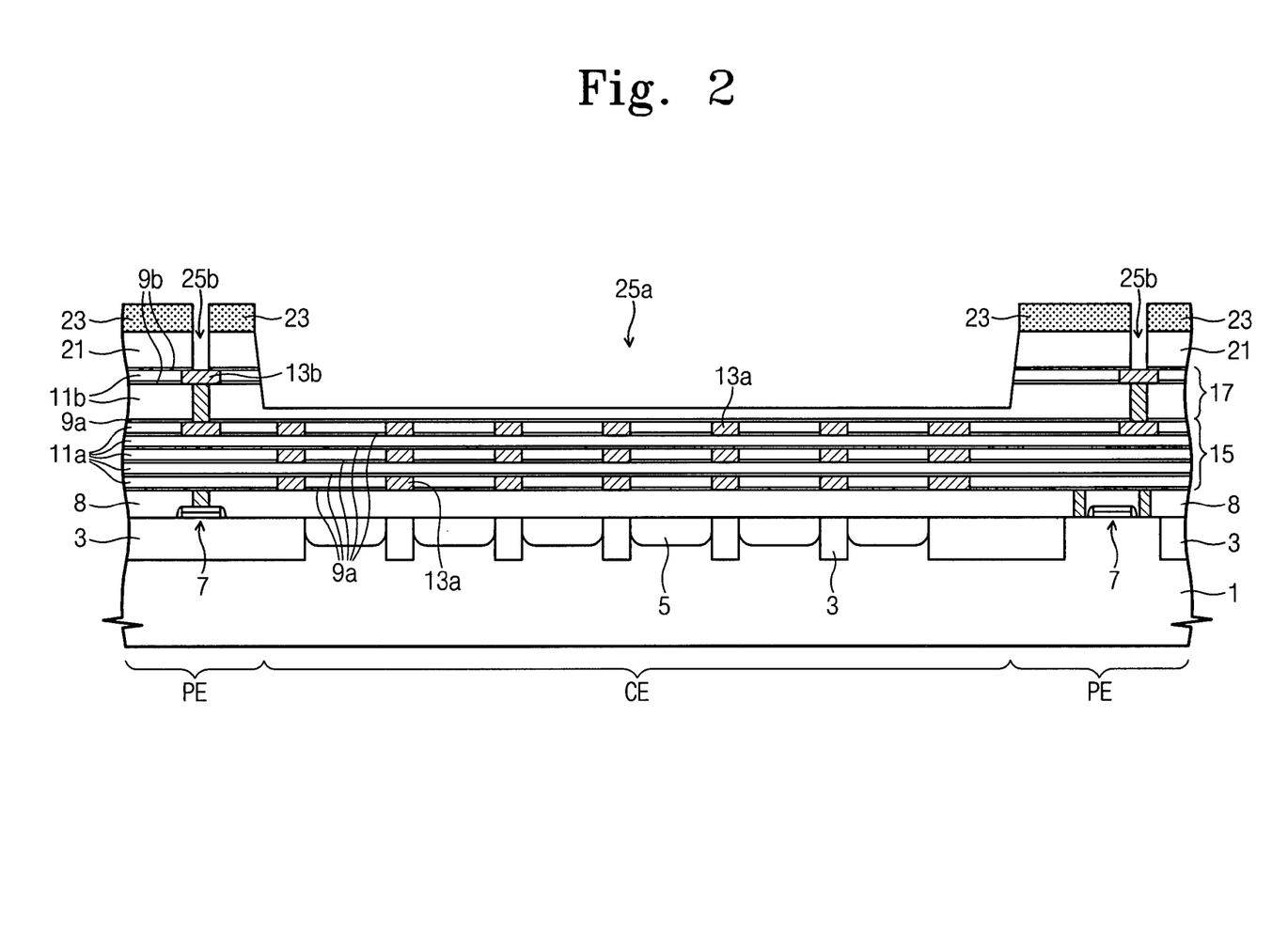

As illustrated in FIG. 2, a first photoresist pattern 23 is formed on the passivation layer 21. The first photoresist pattern 23 has an opening that completely exposes the pixel region CE while exposing a via hole at the peripheral circuit region PE. By means of an etch process using the photoresist pattern 23 as an etch mask, the passivation layer 21 and the underlying the second etch-stop layer 9b in the peripheral circuit region PE are patterned to form a via hole 25b and the passivation layer 21 and the underlying top interconnection layer 17 in the pixel region CE are removed to form a wide recessed region 25b. Thus, the second interlayer dielectrics 11b and the second etch-stop layers 9b are removed in the pixel region CE. In the etch process of this exemplary embodiment, the top interconnection layer 17 is not removed completely and the second interlayer dielectric 110b of the top interconnection layer 17 partially remains, as illustrated in FIG. 2. The etch process is carried out using fluorocarbon gas such as trifluoromethane ($CF_3H$), difluoromethane ($CF_2H_2$) fluoromethane ($CFH_3$), and carbon tetrafluoride ($CF_4$) as an etch gas.

Figure 3:
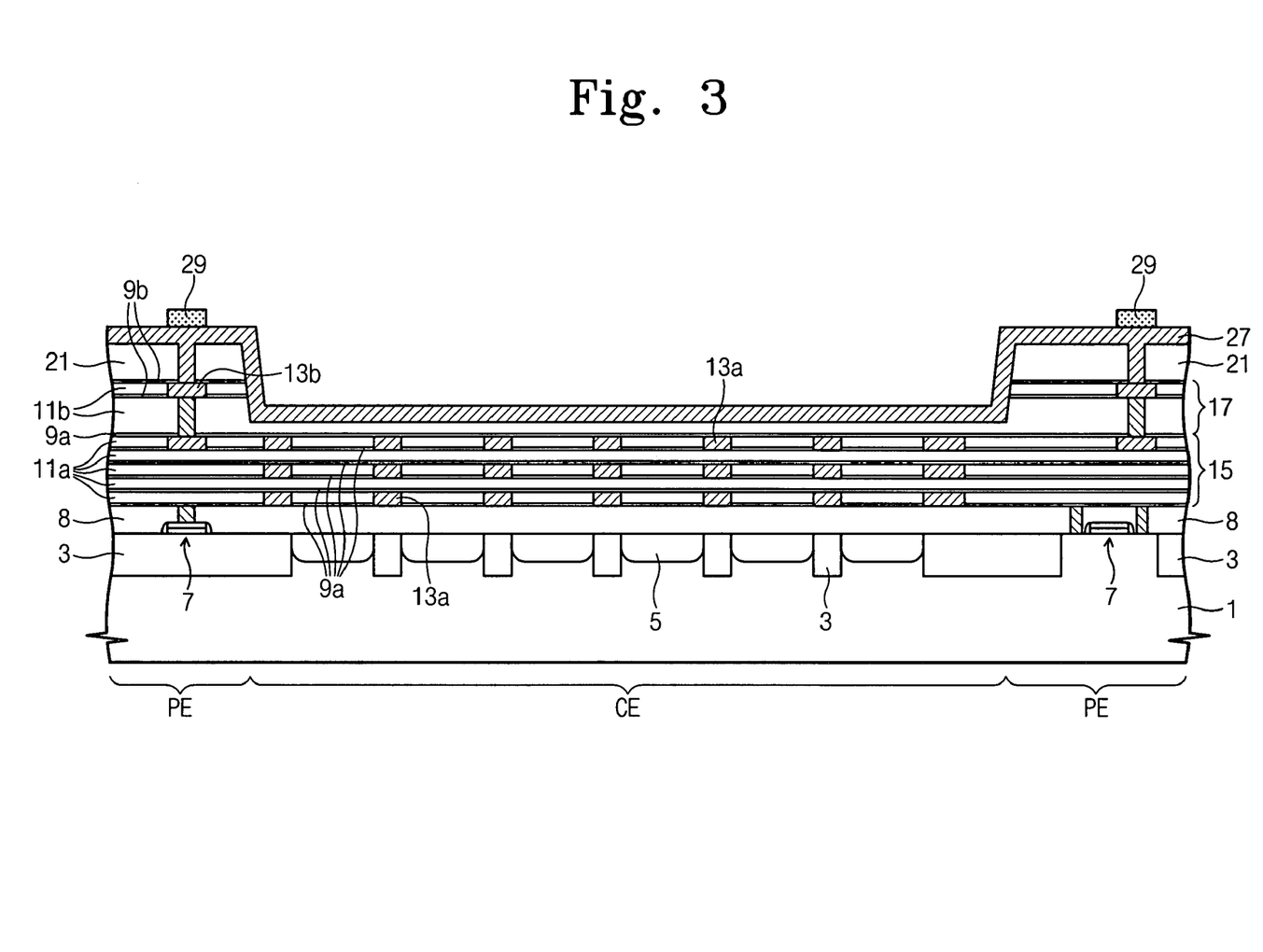

As illustrated in FIG. 3, the photoresist pattern 23 is removed by means of ashing and stripping processes. A conductive layer 27 is conformally stacked on an entire surface of a substrate 1 where the via hole 25b and the recessed region 25a are formed, thereby filling the via hole 25b. The conductive layer 27 is a layer of metal such as, for example, aluminum. Formation of the conductive layer 27 is done by means of chemical vapor deposition (CVD) process. A conductive pad is defined on the conductive layer 27 and is connected to an external terminal, and a second photoresist pattern 29 is formed to overlap the via hole 25b.

Figure 4:
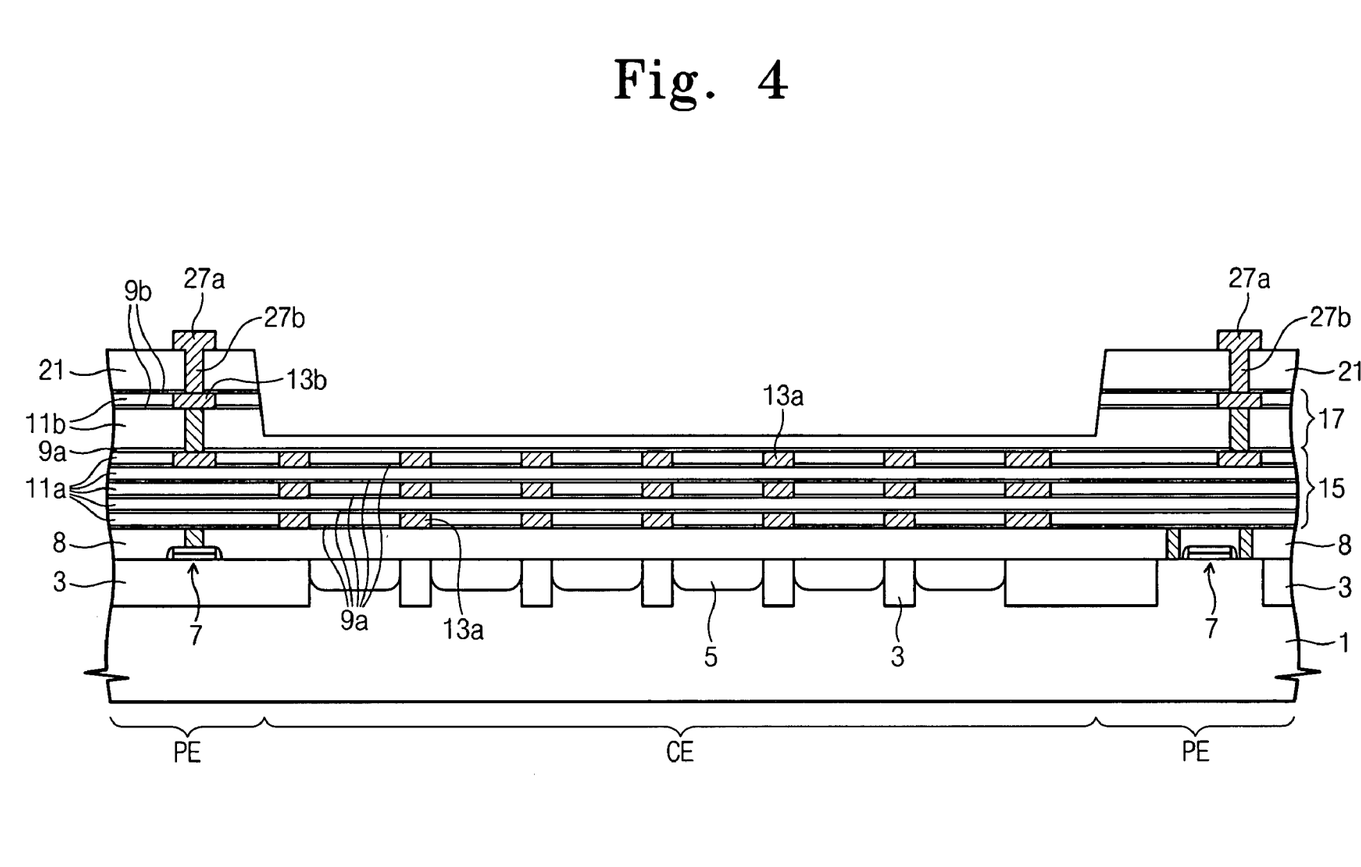

As illustrated in FIG. 4, using the second photoresist pattern 29 as an etch mask, the conductive layer 27 is patterned to be removed completely at the pixel region CE and form a via plug 27b and a conductive pattern 27a in the via hole at the peripheral circuit region 27a. The conductive pattern 27a protrudes outwardly from the via hole 25b and is connected to the via plug 27b. After the etch process is carried out, the second interlayer dielectric 11b of the remaining top interconnection layer 17 at the pixel region CE is removed and the first etch-stop layer 9a is exposed.

As previously described above in relation to the description of a conventional image sensor, loss caused by light interference arises at boundaries between the etch-stop layers 9a and 9b, the interlayer dielectrics 11a and 11b, and the passivation layers 21. Further, the intensity of light impinging on the photoelectric transformation section 5 is lowered due to intrinsic absorption coefficients of the layers. Thus, to enhance the photosensitivity of an image sensor, the top interconnection layer 17 on the pixel region where the photoelectric transformation section 5 is disposed should be removed. Referring to FIG. 3 and FIG. 4 of this exemplary embodiment, the top interconnection layer 17 is removed when the via hole 25b is formed using the first photoresist pattern 23 that is a mask for forming a conductive pad to be connected to an external terminal. Accordingly, the present exemplary embodiment provides a simplified and cost effective process wherein the photosensitivity of an image sensor is enhanced in comparison to conventional image sensors and conventional methods of forming the same.

Figure 5:
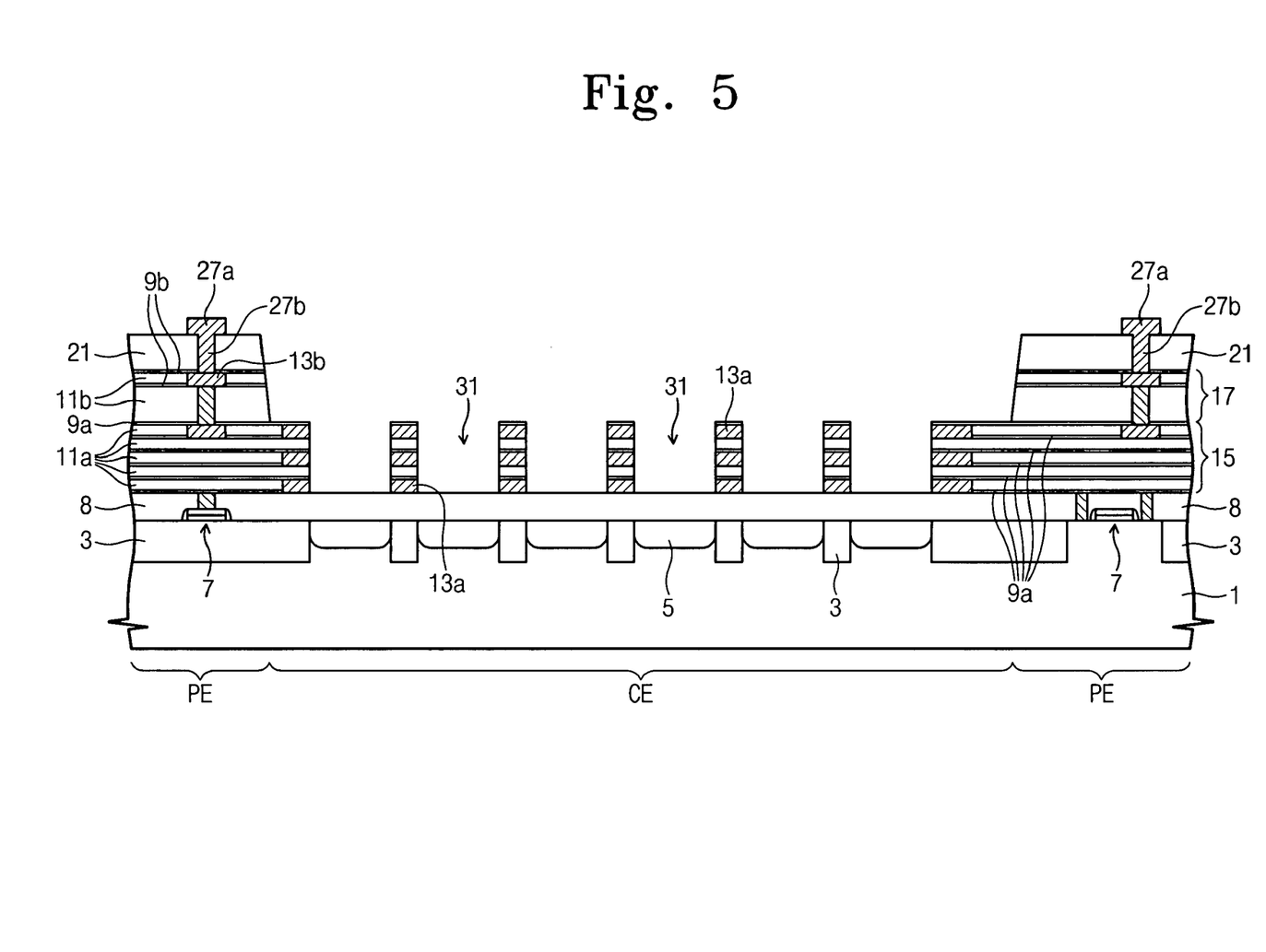

As illustrated in FIG. 5, an etch process is carried out using a third photoresist pattern covering the peripheral circuit region PE except the photoelectric transformation section 5 at the pixel region CE. Thus, the interlayer dielectrics 11a and the first etch-stop layers 9a between the first interconnections 13a of the intermediate interconnection layer 15 are patterned to form a cavity exposing the shield layer 8 on the photoelectric transformation section 5.

Figure 6:
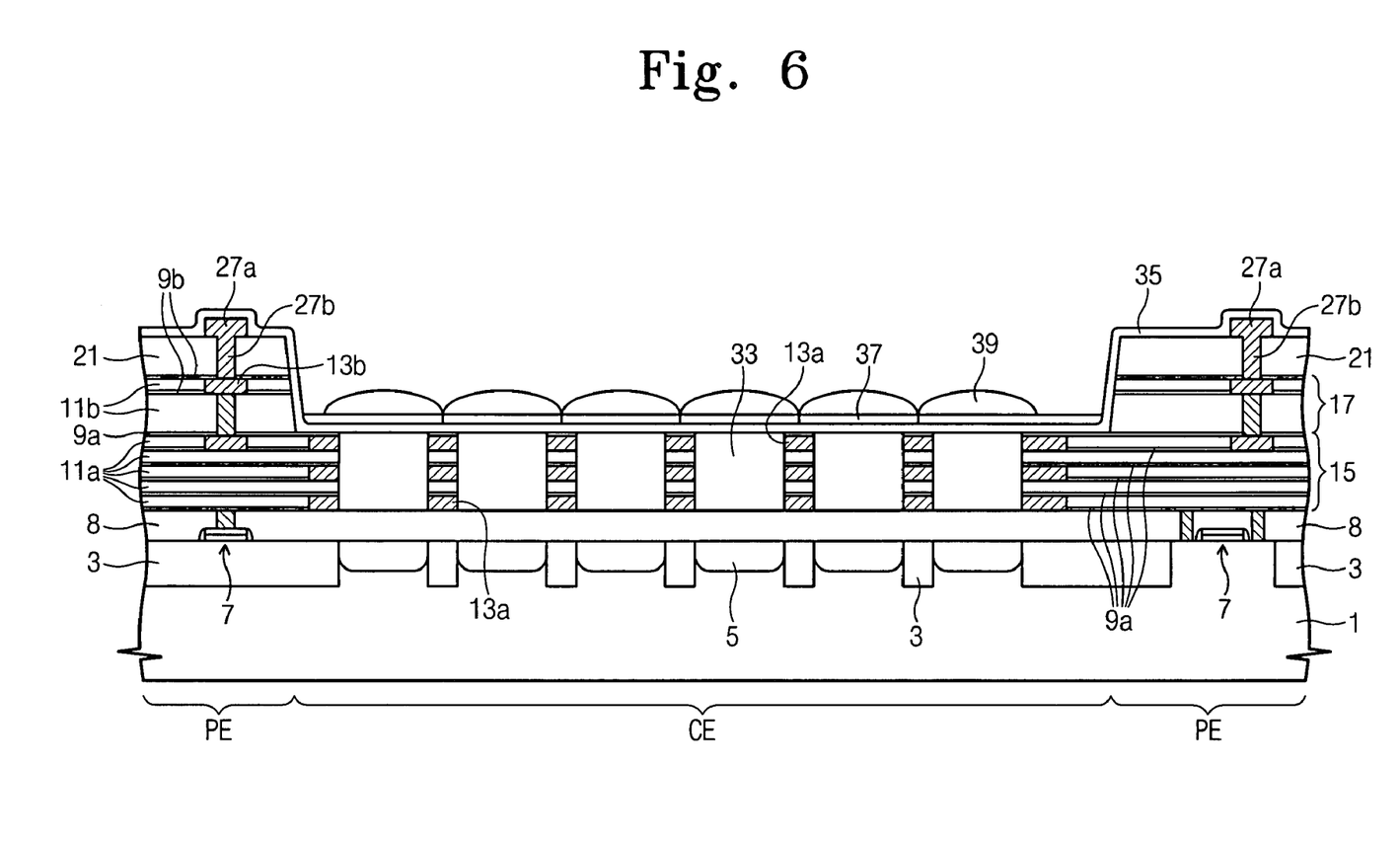

As illustrated in FIG. 6, the third photoresist pattern is removed. After coating a thermosetting resin layer on the entire surface of the substrate 1, it is heated to harden the resin layer. An etch-back process is carried out to remove the hardened resin layer outside the cavity 31 and form a resin layer 33 within the cavity 31. The resin layer has a transmittance of at least about 50 percent. A planarization layer 35 is coated on substantially the entire surface of a semiconductor substrate 1 where the resin layer 33 is formed. The planarization layer 35 is hardened by means of a heat treatment and is made of a thermosetting resin of a polyimide group. In the pixel region CE, a color filter layer 37 is formed on the planarization layer 35. In this exemplary embodiment, the color filter layer 37 is a red-green-blue (RGB) color filter for dividing the natural color into the three primary colors and a complementary color filter for dividing the natural color into four colors, i.e., cyan, yellow, green, and magenta (CYGM). A microlens 39 is formed on the color filter layer 37. The planarization layer in the peripheral circuit region PE is partially patterned in a subsequent process to form an opening exposing the conductive pattern 27a. A wire bonding process is carried out to connect a wire to the opening through the conductive pad 27a.

In the image sensor of FIG. 6, etch-stop layers 9a and 9b and interlayer dielectrics 11a and 11b that reflect or absorb a light on the photoelectric transformation section 5 of the section region CE are removed, thereby lowering the intensity of the light and enhancing the photosensitivity of the image sensor.

In sum, the process of the exemplary embodiments of the invention, by removing unnecessary layers at the pixel region when the via hole is formed at the peripheral circuit region in forming an image sensor, provides a simplified process wherein the photosensitivity of an image sensor prepared therefrom is enhanced in comparison to conventional processes.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of forming an image sensor, comprising:
providing a semiconductor substrate having a pixel region and a peripheral circuit region;
forming a photoelectric transformation section at the semiconductor substrate of the pixel region;
forming a plurality of interlayer dielectrics over the semiconductor substrate with interconnections interposed therebetween;
forming a passivation layer;
partially patterning the passivation layer at the peripheral circuit region to form a via hole exposing the interconnection and removing the passivation layer and the underlying interlayer dielectric at the pixel region;
forming a conductive layer to fill the via hole; and
etching the conductive layer to remove the conductive layer at the pixel region and form a via plug and a conductive pad at the peripheral circuit region, the via plug filling the via hole and the conductive pad protruding outwardly from the via hole.

2. The method as recited in claim 1, further comprising:
removing the interlayer dielectrics on the photoelectric transformation section at the pixel region to form a cavity;
forming a resin layer to fill the cavity;
forming a planarization layer;
forming a color filter layer on the planarization layer at the pixel region; and
forming a microlens on the color filter layer.

3. The method as recited in claim 1, wherein patterning the passivation layer and the interlayer dielectric is conducted using a fluorocarbon gas as an etch gas.

4. The method of claim 1, wherein the first etch-stop layer and the second etch-stop layer are made of silicon nitride ($Si_3N_4$).

5. The method of claim 1, wherein the plurality of interlayer dielectrics each comprise a material selected from the group consisting of silicon oxide ($SiO_2$) and silicon oxyfluoride (SiOF).

6. The method of claim 3, wherein the fluorocarbon etch gas is selected from the group consisting of trifluoromethane ($CF_3H$), difluoromethane ($CF_2H_2$) fluoromethane ($CFH_3$), and carbon tetrafluroide ($CF_4$).

7. The method of claim 1, wherein the conductive layer is formed by a chemical vapor deposition (CVD) process.

8. A method of forming an image sensor, comprising:
preparing a semiconductor substrate having a pixel region and a peripheral circuit region;
forming device isolation layers on the semiconductor substrate to define active regions;
forming a photoelectric transformation section at the active region of the pixel region;
forming a shield layer on substantially an entire surface of the semiconductor substrate;
forming a plurality of intermediate interconnection layers on the shield layer, each of the intermediate interconnection layers comprising a first etch-stop layer, a first interlayer dielectric on the first etch-stop layer, and a first interconnection overlapping the device isolation layer at the active region and penetrating the first interlayer dielectric and the first etch-stop layer;
forming at least one top interconnection layer on the intermediate interconnection layer, the top interconnection layer comprising a second etch-stop layer, a second interlayer dielectric on the second etch-stop layer, and a second interconnection disposed only at the peripheral circuit region and penetrating the second interlayer dielectric and the second etch-stop layer;
forming a passivation layer on the top interconnection layer;
partially patterning the passivation layer at the peripheral circuit region to form a via hole exposing the second interconnection while removing the passivation layer and the top interconnection layer at the pixel region to expose the intermediate interconnection layer;
forming a conductive layer to fill the via hole; and
etching the conductive layer to remove the conductive layer at the pixel region and form a via plug and a conductive pad at the peripheral circuit region, the via plug filling the via hole and the conductive layer protruding outwardly from the via hole.

9. The method as recited in claim 8, wherein the passivation layer is a triple layer comprised of silicon nitride, silicon oxyfluoride, and silicon nitride, and the conductive layer is comprised of a material selected from the group consisting of aluminum, copper, and tungsten.

10. The method as recited in claim 9, wherein patterning the passivation layer and the interconnection layer is conducted using a fluorocarbon gas as an etch gas.

11. The method as recited in claim 8, further comprising:
removing the first interlayer dielectric and the first etch-stop layer of the intermediate interconnection layer at the pixel region to form a cavity exposing the shield layer;
filling a resin layer to fill the cavity;
forming a planarization layer;
forming a color filter layer on the planarization layer at the pixel region; and
forming a microlens on the color filter layer.

12. The method as recited in claim 11, wherein forming the resin layer comprises:
coating a thermosetting resin layer on the semiconductor substrate to fill the cavity;
heating the semiconductor substrate to harden the thermosetting resin layer; and
etching back the hardened thermosetting resin layer to form a resin layer within the cavity.

13. The method of claim 8, wherein the first etch-stop layer and the second etch-stop layer are made of silicon nitride ($Si_3N_4$).

14. The method of claim 8, wherein the first interlayer dielectric and second interlayer dielectric each comprise a material selected from the group consisting of silicon oxide ($SiO_2$) and silicon oxyfluoride (SiOF).

15. The method of claim 10, wherein the fluorocarbon etch gas is selected from the group consisting of trifluoromethane ($CF_3H$), difluoromethane ($CF_2H_2$) fluoromethane ($CFH_3$), and carbon tetrafluroide ($CF_4$).

* * * * *